(12) United States Patent
Aramaki

(10) Patent No.: US 7,587,440 B2
(45) Date of Patent: Sep. 8, 2009

(54) DIGITAL FILTER AND FILTERING METHOD

(75) Inventor: Yoshinori Aramaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 830 days.

(21) Appl. No.: 11/115,204

(22) Filed: Apr. 27, 2005

(65) Prior Publication Data

US 2005/0246404 A1 Nov. 3, 2005

(30) Foreign Application Priority Data

Apr. 28, 2004 (JP) .............................. 2004-134356

(51) Int. Cl.
*G06F 17/10* (2006.01)
(52) U.S. Cl. ....................................... 708/313
(58) Field of Classification Search ................. 708/313
See application file for complete search history.

(56) References Cited

U.S. PATENT DOCUMENTS

| | | | | |
|---|---|---|---|---|
| 4,972,436 A | * | 11/1990 | Halim et al. ................. 375/247 |
| 5,617,344 A | * | 4/1997 | Young et al. ................. 708/313 |
| 5,966,314 A | * | 10/1999 | Lee ............................. 708/319 |
| 6,970,511 B1 | * | 11/2005 | Barnette ................. 375/240.21 |
| 2003/0177156 A1 | * | 9/2003 | Van Der Valk et al. ...... 708/313 |

FOREIGN PATENT DOCUMENTS

JP    H04-245712 A    9/1992

OTHER PUBLICATIONS

"Oversampling A-D conversion technology", Nikkei Business Publications, Inc., p. 119.
"Oversampling A-D conversion technology", Nikkei Business Publications, Inc., p. 119, Dec. 25, 1990.

* cited by examiner

*Primary Examiner*—David H Malzahn
(74) *Attorney, Agent, or Firm*—Sughrue Mion, PLLC

(57) ABSTRACT

The digital filter has a first-stage decimation filter and a second-stage decimation filter. The second-stage decimation filter has a shifter that performs shift operation on a filter coefficient, a complementer that performs complementary operation on the filter coefficient, a reset circuit that resetting the filter coefficient, and an adder that adds values selected from the filter coefficient, a shift operation result from the shifter, and a complementary operation result from the complementer.

24 Claims, 6 Drawing Sheets

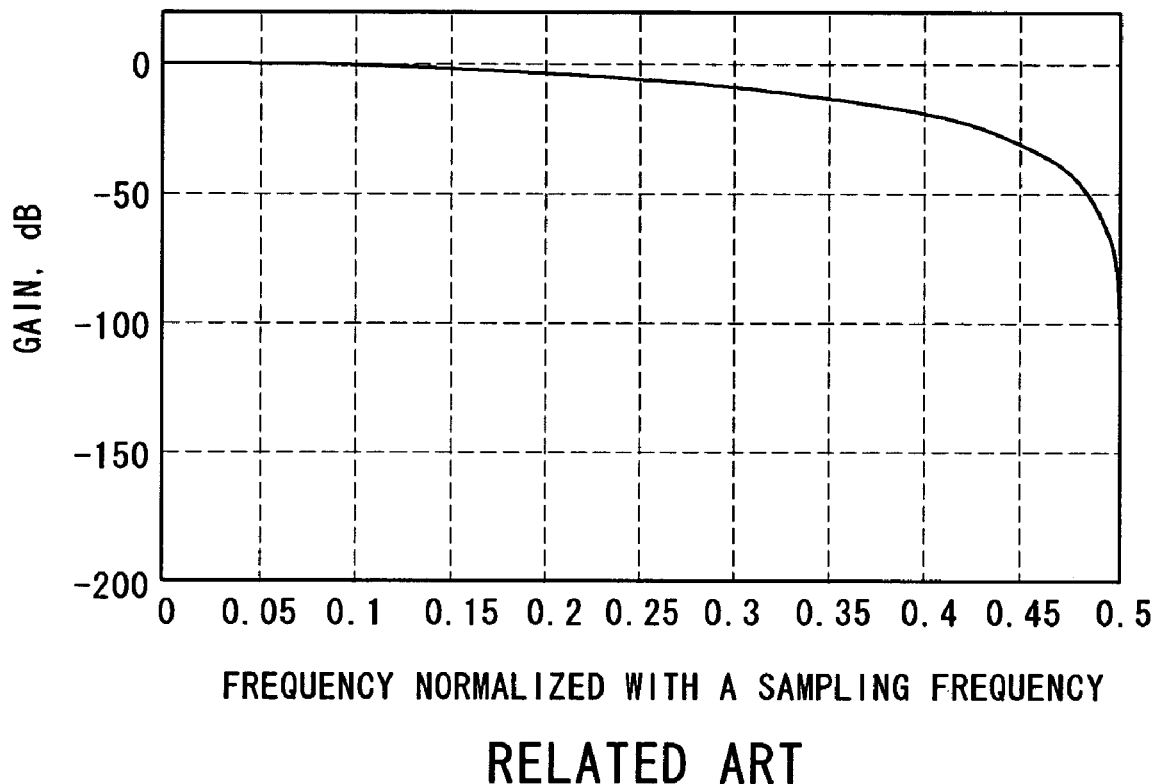

DIGITAL FILTER AND FILTERING METHOD

BACKGROUND OF THE INVENTION

1. Field of the Invention

The present invention relates to a digital filter and a filtering method and, more particularly, to a digital filter and a filtering method that decimate the digital signal which is A/D converted at an oversampling frequency.

2. Description of Related Art

Digital audio equipment use an oversampling A/D converter that samples an analog signal at a higher frequency than an output sampling frequency in order to improve the signal-to-noise ratio (S/N) and increase the dynamic range.

As the oversampling A/D converter, a Delta-Sigma ($\Delta\Sigma$) A/D converter that outputs 1-bit data of a high- or low-level signal at an oversampling rate (frequency) is known. Further, a decimation filter is used to decimate the signal oversampled by the $\Delta\Sigma$ A/D-converter to a given sampling rate.

For example, the $\Delta\Sigma$ A/D converter converts from an analog signal into a 1-bit digital data at 3 MHz sampling rate, and the decimation filter reduces the sampling rate of the digital data to 48 KHz, thereby outputting a 16-bit digital signal. The digital signal with a desired sampling rate is thereby obtained.

Such a decimation filter requires a high-order, complicated digital filter to obtain a desired sampling rate in one decimation step. Therefore, it is common to perform a plurality of decimation steps and use a low-order, simple digital filter.

A decimation filter having a multiplier is described, for example, in Akira Yukawa, "Oversampling A-D conversion technology", Nikkei Business Publications, Inc., Dec. 25, 1990, p. 119. FIG. 4 shows the configuration example of a multiplier decimation filter. This decimation filter includes a first-stage decimation filter 120 and a second-stage decimation filter 130.

For example, the first-stage decimation filter 120 decimates the output signal from an A/D converter (ADC) at a decimation ratio of 1/2. The second-stage decimation filter 130 decimates the output signal from the first-stage decimation filter 120 at a decimation ratio of 1/16.

The first-stage decimation filter 120 is a moving average filter, for example, which is composed of a decoder 121 as shown in FIG. 4. A 1-bit output signal if input to the decoder 121 from the ADC. The decoder 121 calculates a moving average of a plurality of bits and outputs it to the second-stage decimation filter 130.

The second-stage decimation filter 130 is a finite impulse response (FIR) filter, for example. It is composed of a filter coefficient ROM 131, an address counter 132, a multiplier 133, an adder 134, a three-stage shift register 135, and a selector 136.

The address counter 132 counts up or down and sequentially outputs the counted address. The filter coefficient ROM 131 stores filter coefficients of given words and sequentially outputs the filter coefficient of the address specified by the output from the address counter 132.

The multiplier 133 receives the signal from the decoder 121 and the filter coefficient from the filter coefficient ROM 131. The multiplier 133 multiplies the signal values.

The adder 134 receives a multiplication result from the multiplier 133 and a signal from the three-stage shift register 135. The adder 134 adds the signal values. The three-stage shift register 135 sequentially stores three addition results from the multiplier 133 and outputs the oldest addition result to the adder 134 so that the adder 134 further adds the value. After the adder 134 repeats the addition N times, the selector 136 allows the values stored in the three-stage shift register 135 to be output to the outside.

This example uses a three-stage shift register to store addition results for multiplexing, thereby simplifying the circuit configuration. However, use of a multiplier in a decimation filter complicates the circuit configuration and increases the circuit size.

To overcome the above problems, a decimation filter which does not have a multiplier is proposed in Japanese Unexamined Patent Application Publication No. 4-245712 (Maruyama), for example. FIG. 5 shows the configuration example of a decimation filter without multiplier. The decimation filter includes a first-stage decimation filter 120 and a second-stage decimation filter 140.

The first-stage decimation filter 120 is a moving average filter which is composed of a decoder 121 as in FIG. 4. The second-stage decimation filter 140 is a FIR filter, for example, which is composed of a controller 141, a filter coefficient ROM 142, a shifter 143, a complementer 144, a reset circuit 145, an adder 146, and an accumulator 147.

In this decimation filter, the second-stage decimation filter 140 performs a given operation on a filter coefficient according to the output from the first-stage decimation filter 120. To describe the operation principle of the second-stage decimation filter 140, the first-stage decimation filter 120 is described below.

The first-stage decimation filter 120 is a second-order 2-tap moving average filter. The transfer function of this filter is expressed by:

$$H(z) = \frac{1}{4}(1+z^{-1})(1+z^{-1}) = \frac{1}{4}(z^0 + 2z^{-1} + z^{-2}) \quad \text{Formula 4}$$

The 1-bit output from the ADC is the input to the second-order 2-tap moving average filter and assigned to "Z" of Formula 4. In Formula 4, $Z^0$ indicates the present input, $Z^{-1}$ indicates the immediately previous input, and $Z^{-2}$ indicates the second previous input. Thus, the three-bit data from the present to the second previous data is input to the second-order 2-tap moving average filter. The second-order 2-tap moving average filter calculates their moving average and outputs a result.

FIG. 6 shows the frequency characteristics of the second-order 2-tap moving average filter. In FIG. 6, the horizontal axis indicates frequency and the vertical axis indicates gain. The frequency is a value normalized with a sampling frequency (sampling rate). For example, the frequency 0.5 represents 0.5 times the sampling frequency, which is, half the sampling frequency. As shown in FIG. 6, the gain is 0 dB when the frequency is 0, and the gain decreases as the frequency increases. The gain being 0 dB means that an input signal is output without any change, and the gain being –100 dB means that a signal attenuated by 100 dB from the input signal is output. Thus, the second-order 2-tap moving average filter is a low-pass filter which lets through a low frequency component and attenuates a high frequency component. For example, the gain is attenuated to about –35 dB at the frequency 0.45 and it is attenuated to about –100 dB at the frequency 0.5.

If, in the 1-bit data output from the ADC, a high level is represented as "+1" and a low level as "–1", the output of the first-stage decimation filter 120 is "0", "±0.5" or "±1" from Formula 4. The second-stage decimation filter 140 multiplies the output of the first-stage decimation filter 120 and a filter coefficient and adds the result, thereby obtaining an output, as is the case with FIG. 4. Thus, it multiplies a limited value of "0", "±0.5" or "±1" which is the output of the first-stage decimation filter 120, and a filter coefficient. Since the value to be multiplied with the filter coefficient is limited, the multiplication can be implemented by performing the operation shown in Table 4 on the filter coefficient.

TABLE 4

| output | operation on filter coefficient |
|---|---|
| +0.5 | none |
| +1 | 1-bit shift |
| −0.5 | complementation |
| −1 | 1-bit shift, complementation |
| 0 | reset |

Table 4 shows the output of Formula 4 and the operation on the filter coefficient in the second-stage decimation filter 140. In the example of Table 4, "+0.5" is a reference value. When the output is "+0.5", the filter coefficient is not changed since "+0.5" is a reference value. When the output is "+1", the filter coefficient is 1-bit shifted since "+1" is twice the value of "+0.5". When the output is "−0.5", the filter coefficient is complemented since "−0.5" is the negative value of "+0.5". When the output is "−1", the filter coefficient is 1-bit shifted and complemented since "−1" is the negative value of "+1". When the output is "0", the filter coefficient is reset since multiplication of "0" means no operation. The same effect as the multiplication is thereby obtained. Thus, the second-stage decimation filter 140 may be implemented by the combination of "1-bit shift" "complementation", and "reset". Table 5 shows a truth table representing the operation of Table 4.

TABLE 5

| $Z^0$ | $Z^{-1}$ | $Z^{-2}$ | Shift | Comp | Zero | output |
|---|---|---|---|---|---|---|
| 0 | 0 | 0 | 1 | 1 | 0 | −1 |
| 0 | 0 | 1 | 0 | 1 | 0 | −0.5 |
| 0 | 1 | 0 | 0 | 0 | 1 | 0 |
| 0 | 1 | 1 | 0 | 0 | 0 | +0.5 |
| 1 | 0 | 0 | 0 | 1 | 0 | −0.5 |
| 1 | 0 | 1 | 0 | 0 | 1 | 0 |
| 1 | 1 | 0 | 0 | 0 | 0 | +0.5 |
| 1 | 1 | 1 | 1 | 0 | 0 | +1 |

Table 5 shows the input and the output of Formula 4 and the operations performed in the second-stage decimation filter 140. In Table 5, "$Z^0$", "$Z^{-1}$", and "$Z^{-2}$" are the inputs to the Formula 4 and "output" is the output from Formula 4. Since the input to the first-stage decimation filter 120 is 3 bits from Formula 4, the truth table has 8 patterns. In Table 5, "Shift", "Comp", and "Zero" indicate the operations performed in the second-stage decimation filter 140, which correspond to the operations on the filter coefficient shown in Table 4. The "Shift" represents 1-bit shift of a filter coefficient, "Comp" represents complementation of a filter coefficient, and "Zero" represents reset of a filter coefficient.

In FIG. 5, if the input signal of Table 5 is input from the ADC to the first-stage decimation filter 120, the first-stage decimation filter 120 outputs the output signal of Table 5 to the controller 141 of the second-stage decimation filter 140. The controller 141 outputs a control signal for making the shifter 143, the complementer 144, and the reset circuit 145 operate according to Table 5. The controller 141 outputs a control signal for controlling the operation of the shifter 143 if "Shift" is 1 in Table 5, a control signal for controlling the operation of the complementer 144 if "Comp" is 1, and a control signal for controlling the operation of the reset circuit 145 if "Zero" is 1. The filter coefficient ROM 142 sequentially outputs a filter coefficient, and the shifter 143, the complementer 144, and the reset circuit 145 perform a given operation on the filter coefficient according to the control signal from the controller 141.

The adder 146 receives the filter coefficient from the filter coefficient ROM 142, the operation result from the shifter 143, the complementer 144, and the reset circuit 145, and a signal from the accumulator 147. The adder 146 adds these signal values. The addition result of the adder 146 is sequentially stored into the accumulator 147. Thus, the adder 146 adds the operation result of the shifter 143, the complementer 144, and the reset circuit 145 to the operation result up to the previous operation, and the accumulator 147 stores the addition result. After repeating this process N times, the accumulator 147 outputs its contents.

This configuration allows implementation of a decimation filter without a multiplexer. The configuration of FIG. 5, however, only allows the operations of "1-bit shift" "complementation", and "reset" on the filter coefficients, and it is not applicable to the case where the first-stage decimation filter outputs a value different from the values shown in Table 4. It is therefore not applicable to the case where the first-stage decimation filter is a third or higher order 2-tap moving average filter.

As described above, it has now been discovered that a conventional digital filter has a problem that, when decimating an output signal of a third or higher order 2-tap moving average filter or the like, a circuit without a multiplexer as taught by Maruyama cannot be used and a multiplexer is required, complicating the circuit configuration.

SUMMARY OF THE INVENTION

According to one aspect of the invention, there is provided a digital filter including a first decimation section decimating an input signal to a signal with a first sampling frequency; and a second decimation section performing an operation on a filter coefficient according to an output signal of the first decimation section to decimate the output signal of the first decimation section to a signal with a second sampling frequency. The second decimation section includes a filter coefficient storage part pre-storing a filter coefficient; a shift operation part performing shift operation on a filter coefficient acquired from the filter coefficient storage part; a complementary operation part performing complementary operation on a filter coefficient acquired from the filter coefficient storage part; a reset part resetting a filter coefficient acquired from the filter coefficient storage part; an adder part adding values selected from a filter coefficient acquired from the filter coefficient storage part, a result of the shift operation, and a result of the complementary operation; and an integrator part integrating a filter coefficient acquired from the filter coefficient storage part, the result of the shift operation, the result of the complementary operation, a result of the reset, or a result of the addition.

In this digital filter, the second decimation section performs shift operation, complementary operation, and reset on a filter coefficient and further adds these values selectively, thereby allowing effective decimation even if the signal with the first sampling frequency is an output signal of a moving average filter with a third or higher order transfer function. This eliminates the need for placing a multiplexer in the second decimation section and thus allows simplifying the circuit configuration.

According to another aspect of the invention, there is provided a filtering method including decimating an input signal to a signal with a first sampling frequency; and performing an operation on a filter coefficient according to the signal with the first sampling frequency to decimate the signal with the first sampling frequency to a signal with a second sampling frequency. The decimation to the signal with the second sampling frequency includes performing shift operation on a pre-stored filter coefficient, performing complementary operation on a pre-stored filter coefficient, resetting a pre-stored filter coefficient, adding values selected from a pre-stored filter coefficient, a result of the shift operation, and a result of the complementary operation, and integrating a pre-stored filter coefficient, the result of the shift operation, the result of the complementary operation, a result of the reset, or a result of the addition.

In this filtering method, the decimation to the second sampling frequency includes shift operation, complementary operation, and reset on a filter coefficient and further performs selective addition of these values, thereby allowing effective decimation even if the signal with the first sampling frequency is an output signal of a moving average filter with a third or higher order transfer function. This eliminates the need for multiplication in the decimation to the second sampling frequency and thus allows simplifying the circuit configuration.

According to yet another aspect of the invention, there is provided a digital filter performing an operation on a filter coefficient according to a signal with a first sampling frequency to decimate the signal with the first sampling frequency to a signal with a second sampling frequency. The digital filter includes a filter coefficient storage part pre-storing a filter coefficient; a shift operation part performing shift operation on a filter coefficient acquired from the filter coefficient storage part; a complementary operation part performing complementary operation on a filter coefficient acquired from the filter coefficient storage part; a reset part resetting a filter coefficient acquired from the filter coefficient storage part; an adder part adding values selected from a filter coefficient acquired from the filter coefficient storage part, a result of the shift operation, and a result of the complementary operation; and an integrator section integrating a filter coefficient acquired from the filter coefficient storage part, the result of the shift operation, the result of the complementary operation, a result of the reset, or a result of the addition.

This digital filter performs shift operation, complementary operation, and reset on a filter coefficient and further adds these values selectively, thereby allowing effective decimation even if the signal with the first sampling frequency is an output signal of a moving average filter with a third or higher order transfer function. This eliminates the need for placing a multiplexer and thus allows simplifying the circuit configuration.

The present invention provides a digital filter with a simple circuit configuration capable of decimating an output signal of a third or higher order two-tap moving average filter or the like.

BRIEF DESCRIPTION OF THE DRAWINGS

The above and other objects, advantages and features of the present invention will be more apparent from the following description taken in conjunction with the accompanying drawings, in which:

FIG. 6 is a view showing the frequency characteristics of a conventional decimation filter.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
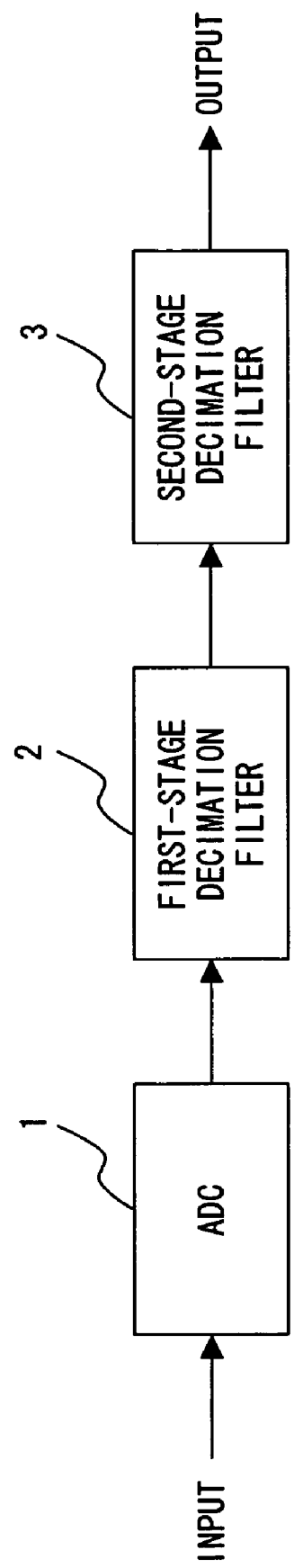
FIG. 1 is a block diagram of an A/D conversion system of the present invention.

The configuration example of an A/D conversion system according to a first embodiment of the invention is described hereinafter with reference to FIG. 1. The A/D conversion system includes an ADC 1, a first-stage decimation filter 2, and a second-stage decimation filter 3. The ADC 1 A/D converts a signal by sampling at an oversampling rate. The first-stage decimation filter 2 decimates the signal to an intermediate sampling rate, which is not a final sampling rate. The second-stage decimation filter 3 decimates the signal to a final sampling rate. The first-stage decimation filter 2 and the second-stage decimation filter 3 may be placed in a Digital Signal Processor (DSP), for example.

The ADC 1 is a $\Delta\Sigma$ A/D converter, for example. It receives an analog signal from the outside of the A/D conversion system, A/D converts the analog signal, and outputs a 1-bit digital signal to the first-stage decimation filter 2. The ADC 1 performs sampling at an oversampling rate (nfs) which is n times higher than a final sampling rate (fs). For example, if fs=48 kHz and n=128, the sampling rate is 128 fs=6144 kHz.

The first-stage decimation filter (first decimation section) 2 is a moving average filter which has a simpler configuration than a FIR filter used for the second-stage decimation filter 3. This embodiment allows use of a third or higher order 2-tap moving average filter for the first-stage decimation filter 2 by placing an adder circuit in the second-stage decimation filter 3.

The first-stage decimation filter 2 receives the 1-bit digital signal oversampled at nfs, performs digital filtering and decimation, and outputs the signal to the second-stage decimation filter 3. The first-stage decimation filter 2 decimates the oversampling rate nfs to a sampling rate 1/k. For example, if 1/K=1/2, the sampling rate is (128/2)fs=64 fs=3072 kHz.

The second-stage decimation filter (second decimation section) 3 is a filter with a greater out-of-band attenuation, and it is a 64-tap FIR filter, for example. The second-stage decimation filter 3 receives the signal sampled at n/k*fs, performs digital filtering and decimation, and outputs a 16-bit digital signal, for example, to the outside of the A/D conversion system. The second-stage decimation filter 3 decimates the intermediate sampling rate n/K*fs to a sampling rate 1/L. For example, if 1/L=1/16, the sampling rate is (64/16)fs=4 fs=192 kHz.

Figure 2:
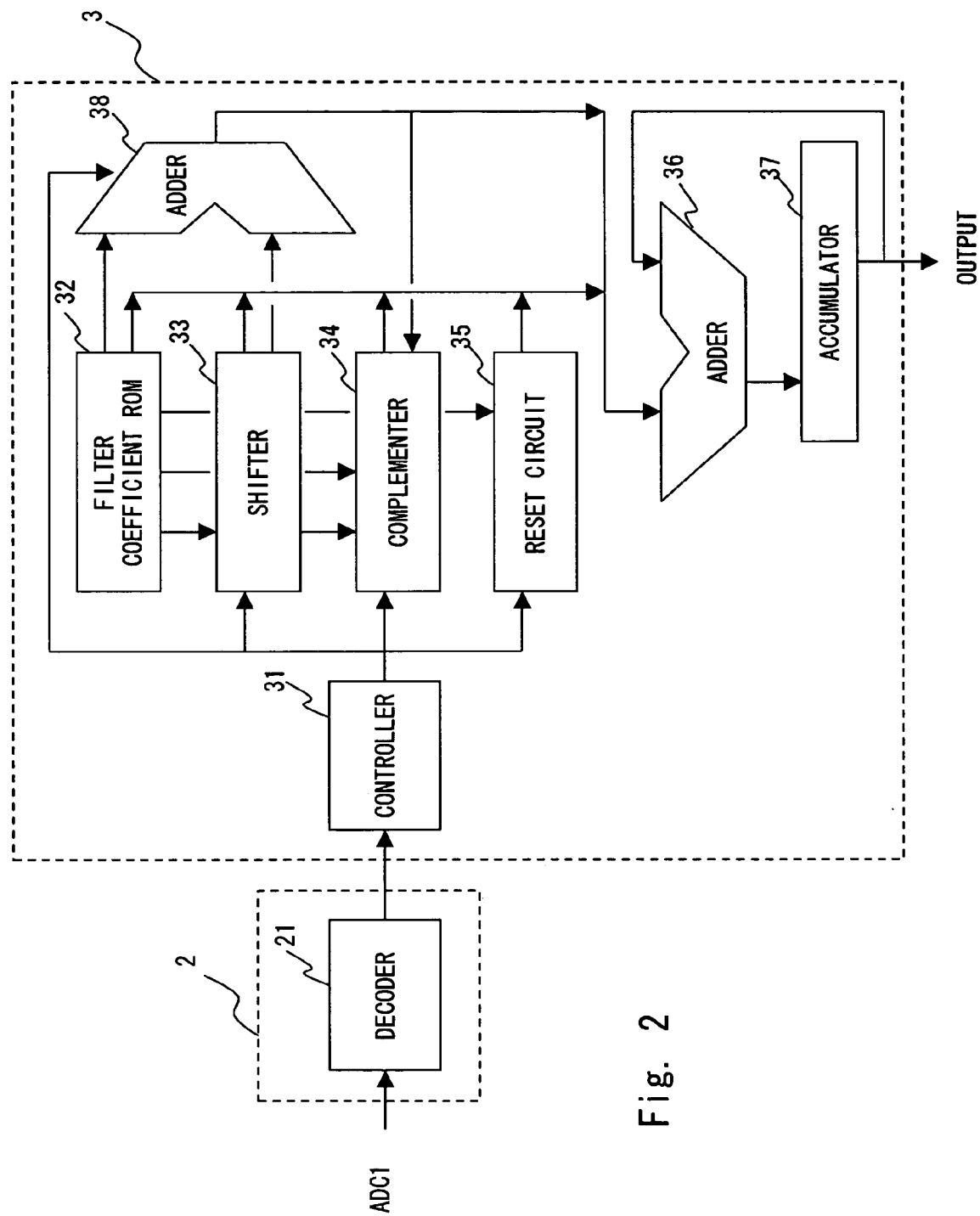
FIG. 2 is a block diagram of a decimation filter of the present invention.

A configuration example of a decimation filter according to this embodiment is described hereafter with reference to FIG. 2. The first-stage decimation filter 2 is composed of a decoder 21. The decoder 21 receives an output signal from the ADC 1 and outputs a decoded signal to the second-stage decimation filter 3. The first-stage decimation filter 2 may have a shift register, a latch circuit and so on as needed in order to implement a third or higher order 2-tap moving average filter.

The second-stage decimation filter 3 is composed of a controller 31, a filter coefficient ROM (filter coefficient storage) 32, a shifter (shift operation part) 33, a complementer (complementary operation part) 34, a reset circuit (reset part) 35, an adder (adder part) 38, an adder 36, and an accumulator 37. The controller 31 controls the operation of the shift circuit 33 or the like according to the output signal from the decoder 21. The filter coefficient ROM 32 pre-stores filter coefficients. The shifter 33 performs shift operation on the filter coefficient acquired from the filter coefficient ROM 32. The complementer 34 performs complementary operation on the filter coefficient acquired from the filter coefficient ROM 32. The reset circuit 35 resets the filter coefficient acquired from the filter coefficient ROM 32. The adder 38 adds the filter coefficient acquired from the filter coefficient ROM 32 and a shift operation result. The adder 36 sequentially multiplies the operation results of the shifter 33, the complementer 34, the reset circuit 35, and the adder 38. The accumulator 37 stores the addition result of the adder 36. The adder 36 and the accumulator 37 are integrators that integrate one of the filter coefficient acquired from the filter coefficient ROM 32, the shift operation result of the shifter 33, the complementary operation result of the complementer 34, the reset result of the reset circuit 35, and the addition result of the adder 38. The connecting relation or the connection order of the input or output signals of the circuits shown in FIG. 2 are just an example, and the connection may be different as long as the operations of Tables 1 and 2, which are described later, can be executed. The adder 38 may be an adder part that adds values selected from the filter coefficient acquired from the filter coefficient ROM 32, the shift operation result of the shifter 33, and the complementary operation result of the complementer 34.

The controller 31 receives the output signal from the decoder 21. The controller 31 outputs a control signal for controlling the operation of the shifter 33, the complementer 34, the reset circuit 35, and the adder 38 according to the input signal.

The filter coefficient ROM 32 stores filter coefficients whose number corresponds to the number of taps of the filter. The filter coefficient ROM 32 sequentially outputs the filter coefficients according to the output rate of the decoder 21. It is feasible to employ an address counter 132 of FIG. 4 to output filter coefficients sequentially.

The shifter 33 receives a filter coefficient from the filter coefficient ROM 32 and a control signal from the controller 31. The shifter 33 performs shift operation on the filter coefficient according to the control signal and outputs an operation result. The shifter 33 may be composed of a shift register, for example.

The complementer 34 receives a filter coefficient from the filter coefficient ROM 32, an operation result from the shifter 33, an addition result from the adder 38, and a control signal from the controller 31. The complementer 34 performs complementary operation on the filter coefficient, the addition result and so on according to the control signal, and outputs an operation result. Though the operation results of the shifter 33 and the adder 38 are input to the complementer 34 in this example, conversely the operation result of the complementer 34 may be input to the shifter 33 and the adder 38. The complementer 34 may be composed of an inverter, for example.

The reset circuit 35 receives a filter coefficient from the filter coefficient ROM 32 and a control signal from the controller 31. The reset circuit 35 performs reset operation on the filter coefficient according to the control signal and outputs an operation result. The reset circuit 35 may be composed of an AND circuit, for example.

The adder 38 receives a filter coefficient from the filter coefficient ROM 32, an operation result from the shifter 33, and a control signal from the controller 31. The adder 38 adds the operation result and the filter coefficient according to the control signal, and outputs an addition result.

Figure 4:
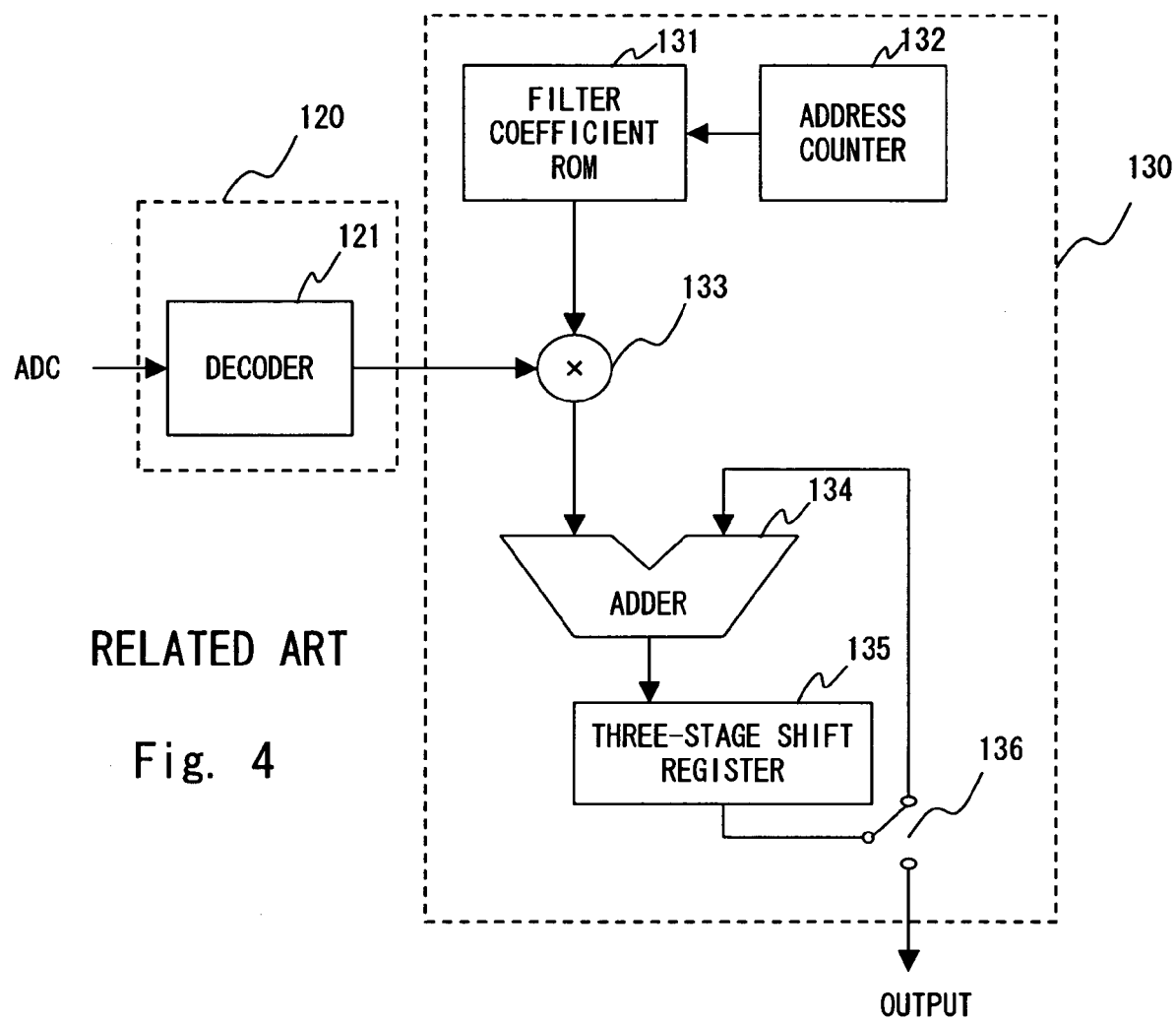
FIG. 4 is a block diagram of a conventional decimation filter.
Figure 5:
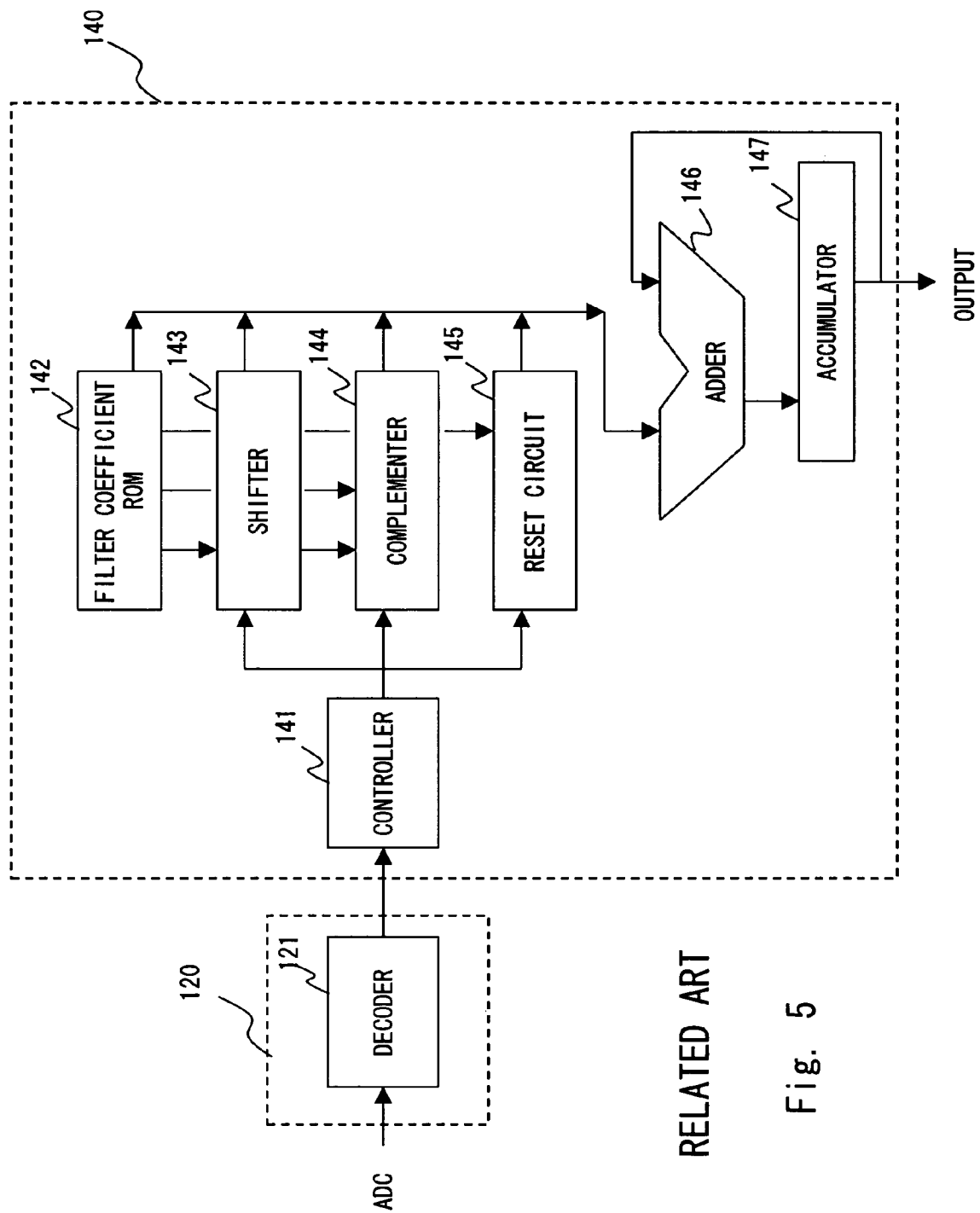
FIG. 5 is a block diagram of a conventional decimation filter.

The adder 36 receives a filter coefficient from the filter coefficient ROM 32, operation results from the shifter 33, the complementer 34, the reset circuit 35, and the adder 38, and the value stored in the accumulator 37. The adder 36 adds these values. The addition results of the adder 36 are sequentially stored into the accumulator 37, and the accumulator 37 outputs a storage result. Thus, the adder 36 integrates the operation results of the shifter 33, the complementer 34, the reset circuit 35, and the adder 38 to the results up to the previous operation, and then the accumulator 37 stores the operation result. The operation result added and stored N times according to the number of taps of the filter is output to the outside, and the accumulator 37 is reset at this time. The accumulator 37 may store one operation result only or a plurality of operation results as a plurality of stages of shift register as in FIG. 4. It is also possible to switch the output from the accumulator 37 by the selector 136 or the like as shown in FIG. 4.

To describe the operation principle of the second-stage decimation filter 3, the first-stage decimation filter 2 is described below. The first-stage decimation filter 2 is a third-order 2-tap moving average filter in this example. The transfer function of this filer is expressed by:

$$H(z) = \frac{1}{8}(1+z^{-1})(1+z^{-1})(1+z^{-1}) = \frac{1}{8}(z^0 + 3z^{-1} + 3z^{-2} + z^{-3}) \quad \text{Formula 1}$$

The 1-bit output from the ADC 1 is the input to the third-order 2-tap moving average filter and assigned to "Z" of Formula 1. In Formula 1, $Z^0$ indicates the present input, $Z^{-1}$ indicates the immediately previous input, $Z^{-2}$ indicates the second previous input, and $Z^{-3}$ indicates the third previous input. The third-order 2-tap moving average filter receives 4-bit input data of the present to the third previous data, calculates their moving average, and outputs the result.

Figure 3:
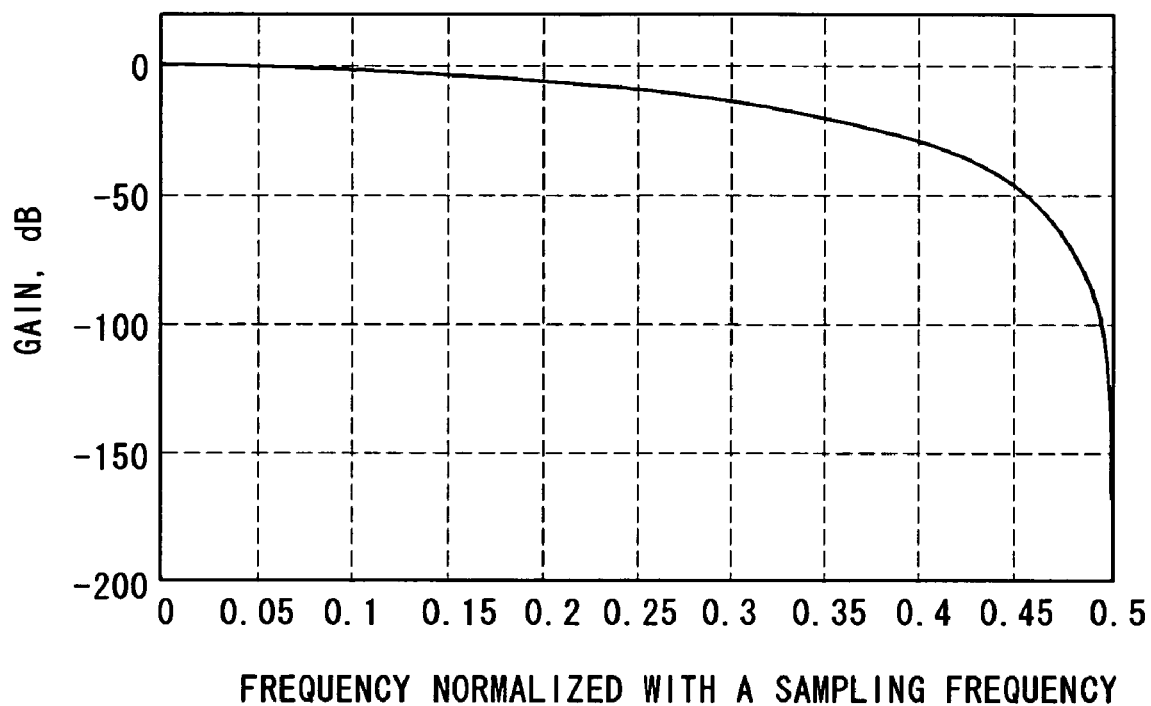
FIG. 3 is a view showing the frequency characteristics of a decimation filter of the present invention.

FIG. 3 shows the frequency characteristics of the third-order 2-tap moving average filter. In FIG. 3, the horizontal axis indicates frequency normalized with a sampling rate and the vertical axis indicates gain. As shown in FIG. 3, the gain is 0 dB when the frequency is 0, and the gain decreases as the frequency increases, indicating that the moving average filter is a low-pass filter.

The gain is attenuated to about −50 dB at the frequency 0.45 and it is attenuated to about −150 dB at the frequency 0.5. The attenuation is greater than that of the second-order 2-tap moving average filter shown in FIG. 6. The greater attenuation allows the more secure blocking of signals, which improves the characteristics of the low-pass filter. A higher order of the moving average filter can further improve the characteristics of the low-pass filter.

The second-stage decimation filter 3 is a 64-tap FIR filter, for example. The transfer function of this filter is expressed by:

$$H(z) = 2 \cdot \sum_{i=0}^{63} (a_i \cdot z^{-i})$$ Formula 2

In Formula 2, $a_i$ is a filter coefficient stored in the filter coefficient ROM 32, and Z is a value output from the first-stage decimation filter 2. In this example, 64 filter coefficients from $a_0$ to $a_{63}$ are stored in the filter coefficient ROM 32 and output from the filter coefficient ROM 32 sequentially from $a_0$. As shown in Formula 2, the 64-tap FIR filter sequentially multiplies the input data and the filter coefficient and adds the multiplication result to the previous accumulated multiplication results. This process is repeated 64 times for convolution and then a result is output.

If, in the 1-bit data output from the ADC 1, a high level is represented as "+1" and a low level as "−1", the output from the first-stage decimation filter 2 is "0", "±0.25", "±0.5", "±0.75", or "±1" from Formula 1. The second-stage decimation filter 3 multiplies the output of the first-stage decimation filter 2 and a filter coefficient as shown in Formula 2. Thus, the second-stage decimation filter 3 multiplies a limited value of one of "0", "±0.25", "±0.5", "±0.75", and "±1", which is the output of the first-stage decimation filter 2, with the filter coefficient. Since the value to be multiplied with the filter coefficient is limited, the multiplication can be implemented by performing the operation shown in Table 1 on the filter coefficient.

TABLE 1

| output | operation on filter coefficient |
|---|---|
| +0.25 | None |
| +0.5 | 1-bit shift |
| −0.25 | Complementation |
| −0.5 | 1-bit shift, complementation |
| +1 | 2-bit shift |
| +0.75 | 1-bit shift, addition to the value before 1-bit shift |
| −1 | 2-bit shift, complementation |
| −0.75 | 1-bit shift, addition to the value before 1-bit shift, complementation |
| 0 | Reset |

Table 1 shows the output of Formula 1 and the operation on the filter coefficient in the second-stage decimation filter 3. In the example of Table 1, "+0.25" is a reference value. When the output is "+0.25", the filter coefficient is not changed (as-is) since "+0.25" is a reference value. When the output is "+0.5", the filter coefficient is 1-bit shifted since "+0.5" is twice the value of "+0.25". When the output is "−0.25", the filter coefficient is complemented since "−0.25" is the negative value of "+0.25". When the output is "−0.5", the filter coefficient is 1-bit shifted and complemented since "−0.5" is the negative value of "+0.5". When the output is "+1", the filter coefficient is 2-bit shifted since "+1" is four times the value of "+0.25". When the output is "+0.75", the filter coefficient is 1-bit shifted-and added to the value before 1-bit shift since "+0.75" is the three times the value of "+0.25". When the output is "−1", the filter coefficient is 2-bit shifted and complemented since "−1" is the negative value of "+1". When the output is "−0.75", the filter coefficient is 1-bit shifted, added to the value before 1-bit shift, and complemented since "−0.75" is the negative value of "+0.75". When the output is "0", the filter coefficient is reset since multiplication of "0" means no operation. The same effect as the multiplication is thereby obtained. Thus, the second-stage decimation filter 3 may be implemented by the combination of "1-bit shift" "complementation", "reset", and "addition". In this example, if the output has an opposite sign to the reference value, complementary operation is performed on the filter coefficient. If the output is 0, the filter coefficient is reset. This example produces the same result as multiplication by bit-shifting the filter coefficient by a multiplier factor "N" for the input value of "Nth" power of 2 ("N" is a natural number) times the reference values such as twice and four times the reference value. Further, it produces the same result as multiplication by adding a bit-shifted filter coefficient to a filter coefficient before bit-shift for the input value of odd number times the reference value, such as three times the reference value. Table 2 is a truth table representing the operation of Table 1.

TABLE 2

| $Z^0$ | $Z^{-1}$ | $Z^{-2}$ | $Z^{-3}$ | Shift2 | Shift1 | Comp | Zero | Add | output |
|---|---|---|---|---|---|---|---|---|---|
| 0 | 0 | 0 | 0 | 1 | 0 | 1 | 0 | 0 | −1 |
| 0 | 0 | 0 | 1 | 1 | 1 | 1 | 0 | 1 | −0.75 |
| 0 | 0 | 1 | 0 | 0 | 0 | 1 | 0 | 0 | −0.25 |
| 0 | 0 | 1 | 1 | 0 | 0 | 0 | 1 | 0 | 0 |
| 0 | 1 | 0 | 0 | 0 | 0 | 1 | 0 | 0 | −0.25 |
| 0 | 1 | 0 | 1 | 0 | 0 | 0 | 1 | 0 | 0 |
| 0 | 1 | 1 | 0 | 0 | 1 | 0 | 0 | 0 | +0.5 |
| 0 | 1 | 1 | 1 | 1 | 1 | 0 | 0 | 1 | +0.75 |
| 1 | 0 | 0 | 0 | 1 | 1 | 1 | 0 | 1 | −0.75 |
| 1 | 0 | 0 | 1 | 1 | 1 | 1 | 0 | 0 | −0.5 |
| 1 | 0 | 1 | 0 | 0 | 0 | 0 | 1 | 0 | 0 |
| 1 | 0 | 1 | 1 | 0 | 0 | 0 | 0 | 0 | +0.25 |
| 1 | 1 | 0 | 0 | 0 | 0 | 0 | 1 | 0 | 0 |
| 1 | 1 | 0 | 1 | 0 | 0 | 0 | 0 | 0 | +0.25 |
| 1 | 1 | 1 | 0 | 1 | 1 | 0 | 0 | 1 | +0.75 |
| 1 | 1 | 1 | 1 | 1 | 0 | 0 | 0 | 0 | +1 |

Table 2 shows the input and output of Formula 1 and the operations performed in the second-stage decimation filter 3. In Table 2, "$Z^0$", "$Z^{-1}$", "$Z^{-2}$" and "$Z^{-3}$" are the inputs to Formula 1 and "output" is the output of Formula 1. Since the input to the first-stage decimation filter 2 is 4 bits from Formula 1, the truth table has 16 patterns. In Table 2, "Shift2", "Shift1", "Comp", "Zero", and "Add" indicate the operations performed in the second-stage decimation filter 3, and they correspond to the operations on the filter coefficients shown in Table 1. The "Shift2" represents 2-bit shift, "Shift1" represents 1-bit shift, "Comp" represents complementation, "Zero" represents reset, and "Add" represents addition.

In FIG. 2, if the input signal of Table 2 is input from the ADC 1 to the first-stage decimation filter 2, for example, the first-stage decimation filter 2 outputs the output signal of Table 2 to the controller 31 of the second-stage decimation filter 3. The controller 31 then outputs control signals for making the shifter 33, the complementer 34, the reset circuit 35, and the adder 38 operate according to Table 2. If, in Table 2, "Shift2" is 1, a control signal for 2-bit shift operation is input to the shifter 33, and, if "Shift1" is 1, a control signal for 1-bit shift operation is input to the shifter 33. Further, the controller 31 outputs a control signal to bring the complementer 34 into operation if "Comp" is 1, outputs a control signal for instructing the reset circuit 35 to operate if "Zero" is 1, and signals the adder 38 to operate if "Add" is 1. The filter coefficient ROM 32 sequentially outputs a filter coefficient, and the shifter 33, the complementer 34, the reset circuit 35, and the adder 38 perform operations on the filter coefficient in accordance with the control signal from the controller 31. After that, the adder 36 adds the filter coefficient from the filter coefficient ROM 32 or the operation result from the shifter 33, the complementer 34, the reset circuit 35, and the adder 38 to the addition result up to the previous operation from the accumulator 37, and stores the result in the accumulator 37. This process is repeated N times, and the accumulator 37 outputs its stored data.

In this configuration where the second-stage decimation filter is provided with an adder that adds the results of shift operation, it is possible to form a filter without a multiplexer even if the first-stage decimation filter is a third-order 2-tap moving average filter. No use of a multiplexer in the second-stage decimation filter simplifies the circuit configuration and prevents increase in the circuit size. Further, use of a third-order 2-tap moving average filter for the first-stage decimation filter improves the filter characteristics and accurately removes noises such as conversion noise contained in an output signal of the A/D converter.

Other Embodiment

Though a third-order two-tap moving average filter is used for the first-stage decimation filter 2 in the above embodiment, the present invention is not limited thereto, and a fourth or higher order 2-tap moving average filter may be used for the first-stage decimation filter 2. The transfer function of a fourth-order 2-tap moving average filter is expressed, for example, by:

$$H(z) = \frac{1}{16}(1+z^{-1})(1+z^{-1})(1+z^{-1})(1+z^{-1}) = \frac{1}{16}(z^0 + 4z^{-1} + 6z^{-2} + 4z^{-3} + z^{-4})$$

Formula 3

The 1-bit output from the ADC 1 is the input of the fourth-order 2-tap moving average filter, and assigned to "Z" of Formula 3. In Formula 3, $Z^0$ indicates the present input, $Z^{-1}$ indicates the immediately previous input, $Z^{-2}$ indicates the second previous input, $Z^{-3}$ indicates the third previous input, and $Z^{-4}$ indicates the fourth previous input. Thus, the fourth-order 2-tap moving average filter inputs 5-bit data from the present to the fourth previous data, calculates their moving average, and outputs a result.

As is the case with the above embodiments, if, in the 1-bit data output from the ADC 1, a high level is represented as "+1" and a low level as "−1", the output from the first-stage decimation filter 2 is "0", "±0.125", "±0.25", "±0.375", "±0.5", "±0.75", "±0.875" or "±1" from Formula 3. In this case, the second-state decimation filter 3 can implement the same operation as multiplication by performing the operations shown in Table 3 on the filter coefficient.

TABLE 3

| output | operation on filter coefficient |
|---|---|
| +0.125 | none |
| +0.25 | 1-bit shift |
| −0.125 | complementation |
| −0.25 | 1-bit shift, complementation |
| +0.375 | 1-bit shift, addition to the value before 1-bit shift |
| −0.375 | 1-bit shift, addition to the value before 1-bit shift, complementation |
| +0.5 | 2-bit shift |
| −0.5 | 2-bit shift, complementation |
| +0.75 | 2-bit shift, addition to the 1-bit shifted value |
| −0.75 | 2-bit shift, addition to the 1-bit shifted value, complementation |
| +0.875 | 2-bit shift, addition to the 1-bit shifted value, addition to the value before 1-bit shift |

TABLE 3-continued

| output | operation on filter coefficient |
|---|---|
| −0.875 | 2-bit shift, addition to the 1-bit shifted value, addition to the value before 1-bit shift, complementation |
| +1 | 3-bit shift |
| −1 | 3-bit shift, complementation |
| 0 | reset |

In the example of Table 3, "+0.125" is a reference value. When the output is "+0.75", a 2-bit shifted filter coefficient and a 1-bit shifted filter coefficient are added since "+0.75" is six times greater than "+0.125", that is, "+0.5+0.25". When the output is "+0.875", a 2-bit shifted filter coefficient, a 1-bit shifted filter coefficient, and a filter coefficient before 1-bit shift are added since "+0.875" is seven times greater than "+0.125", that is, "+0.75+0.125" When the output is "+1", the filter coefficient is 3-bit shifted since "+1" is eight times greater than "+0.125". The other cases are the same as in Table 1 and thus not described. This embodiment produces the same result as multiplication by adding a plurality of bit-shifted values for the input value of even number other than "Nth" power of 2 ("N" is natural number) times the reference value, such as six times the reference value.

It is possible to apply the configuration of FIG. 2 to a fourth-order 2-tap moving average filter by representing Table 3 with a truth table like Table 2. Application to a fifth- or higher order 2-tap moving average filter can be implemented easily referring to Tables 1 and 3 and the description is omitted.

Though the above embodiments describe the configuration where the output signal of the A/D converter is directly input to the first-stage decimation filter, this invention is not limited thereto. The configuration may be different as long as the similar signal to the output signal of the A/D converter is input to the first-stage decimation filter.

It is apparent that the present invention is not limited to the above embodiment that may be modified and changed without departing from the scope and spirit of the invention.

What is claimed is:

1. A digital filter comprising:
a first decimation section decimating an input signal to a signal with a first sampling frequency; and
a second decimation section performing an operation on a filter coefficient according to an output signal of the first decimation section and decimating the output signal of the first decimation section to a signal with a second sampling frequency, the second decimation section comprising:
a filter coefficient storage part pre-storing a filter coefficient;
a shift operation part acquiring a filter coefficient from the filter coefficient part and performing a shift operation on the acquired filter coefficient;
a complementary operation part acquiring a filter coefficient from the filter coefficient storage part and performing a complementary operation on the acquired filter coefficient acquired;
a reset part acquiring a filter coefficient from the filter coefficient storage part and resetting the acquired filter coefficient;
an adder part acquiring a filter coefficient from the filter coefficient storage part and adding the acquired filter coefficient, and a result of the shift operation; and an integrator part integrating the acquired filter coefficient, the result of the complementary operation, a result of the reset part, or a result of the addition.

2. The digital filter according to claim 1, wherein the first decimation section is a moving average filter with a third or higher order transfer function.

3. The digital filter according to claim 1, wherein the input signal is a one-bit digital signal AD-converted at an oversampling frequency in delta-sigma conversion.

4. The digital filter according to claim 1, wherein the filter coefficient storage part is ROM which stores a plurality of filter coefficients and outputs one of the stored filter coefficients.

5. The digital filter according to claim 1, wherein the complementary operation part acquires the result of the addition from the adder part, and performs a complementary operation on the acquired the result of the addition.

6. The digital filter according to claim 1, wherein
the first decimation section outputs signals with a plurality of output values including a reference value,
the shift operation part performs a shift operation on the acquired filter coefficient if the output value of the first decimation section is Nth power of 2 (N is a natural number) times greater than the reference value,
the complementary operation part performs a complementary operation on the acquired filter coefficient if the output value of the first decimation section has an opposite sign to the reference value, and
the reset part resets the acquired filter coefficient if the output value of the first decimation section is 0.

7. The digital filter according to claim 6, wherein, if the output value of the first decimation section is an even number other than Nth power of 2 times the reference value, the shift operation part performs a shift operation a plurality of times on the acquired filter coefficient, and the adder part adds results of the shift operations.

8. The digital filter according to claim 6, wherein, if the output value of the first decimation section is an odd number times the reference value, the shift operation part performs a shift operation on the acquired filter coefficient, and the adder part adds the acquired filter coefficient and a result of the shift operation.

9. The digital filter according to claim 8, wherein, if the output value of the first decimation section is an even number other than Nth power of 2, times the reference value, the shift operation part performs a shift operation a plurality of times on the acquired filter coefficient, and the adder part adds results of the shift operations.

10. The digital filter according to claim 1, wherein the second decimation section further comprises a control part controlling each operation of the shift operation part, the complementary operation part, the reset part, and the adder part according to the output signal from the first decimation section.

11. The digital filter according to claim 10, wherein
the first decimation section outputs signals with a plurality of output values including a reference value,
the shift operation part performs a shift operation on the acquired filter coefficient if the output value of the first decimation section is Nth power of 2 (n is natural number) times greater than the reference value,
the complementary operation part performs a complementary operation on the acquired filter coefficient if the output value of the first decimation section has an opposite sign to the reference value, and
the reset part resets the acquired filter coefficient if the output value of the first decimation section is 0.

12. The digital filter according to claim 11, wherein, if the output value of the first decimation section is an even number other than Nth power of 2, times reference value, the shift operation part performs a shift operation a plurality of times on the acquired filter coefficient, and the adder part adds results of the shift operations.

13. The digital filter according to claim 11, wherein, if the output value of the first decimation section is an odd number times the reference value, the shift operation part performs a shift operation on the acquired filter coefficient, and the adder part adds the acquired filter coefficient and a result of the shift operation.

14. The digital filter according to claim 13, wherein, if the output value of the first decimation section is an even number other than Nth power of 2, the reference value, the shift operation part performs a shift operation a plurality of times on the acquired filter coefficient, and the adder part adds results of the shift operations.

15. A filtering method comprising:
decimating an input signal to a signal with a first sampling frequency; and
performing a given operation on a filter coefficient according to the signal with the first sampling frequency and decimating the signal with the first sampling frequency to a signal with a second sampling frequency by a process including:
pre-storing the filter coefficients;
acquiring the filter coefficient and performing a shift operation on the acquired filter coefficient;
acquiring the filter coefficient and performing a complementary operation on the acquired filter coefficient;
acquiring the filter coefficient and resetting the acquired filter coefficient;
acquiring the filter coefficient and adding the acquired filer coefficient, and a result of the shift operation; and
integrating the acquired filter coefficient, the result of the shift operation, the result of the complementary operation, a result of the reset part, or a result of the addition.

16. The filtering method of claim 15, wherein the decimation to the signal with the second sampling frequency further comprises controlling each of the shift operation, the complementary operation, the reset, and the addition according to the signal with the first sampling frequency.

17. The filtering method of claim 15, wherein
output of the decimation to the signal with the first sampling frequency includes a plurality of output values including a reference value,
the decimation to the signal with the second sampling frequency performs shift operation on the acquired filter coefficient if the output value is Nth power of 2 (N is a natural number) times greater than the reference value, performs a complementary operation on the acquired filter coefficient if the output value has a sign opposite to the reference value, and resets the acquired filter coefficient if the output value is 0.

18. The filtering method of claim 17, wherein, if the output value is an odd number times the reference value, the decimation to the signal with the second sampling frequency performs a shift operation on the acquired filter coefficient, and adds the acquired filter coefficient and a result of the shift operation.

19. The filtering method of claim 17, wherein, if the output value of the first decimation section is even number other than times the reference value, the decimation to the signal with the second sampling frequency performs a shift operation a plurality of times on the acquired filter coefficient, and adds the results of the shift operations.

20. A digital filter performing an operation on a filter coefficient according to a signal with a first sampling frequency to decimate the signal with the first sampling frequency to a signal with a second sampling frequency, the digital filter comprising:
- a filter coefficient storage part pre-storing a filter coefficient;
- a shift operation part acquiring a filter coefficient from the filter coefficient storage part and performing a shift operation on the acquired filter coefficient;
- a complementary operation part acquiring a filter coefficient from the filter coefficient storage part and performing a complementary operation on the acquired filter coefficient;
- a reset part acquiring a filter-coefficient from the filter coefficient storage part and resetting the acquired filter coefficient;
- an adder part acquiring a filter coefficient from the filter coefficient storage part and adding the acquired filter coefficient, and a result of the shift operation; and
- an integrator section integrating the acquired filter coefficient, the result of the shift operation, the result of the complementary operation, a result of the reset part, or a result of the addition.

21. The digital filter of claim 20, further comprises a control part controlling each operation of the shift operation part, the a complementary operation part, the rest part, and the adder part according to the signal with the first sampling frequency.

22. A digital filter performing a given operation on a filter coefficient according to a signal with a first sampling frequency and decimating the signal with the first sampling frequency to a signal with a second sampling frequency, the digital filter comprising:
- a filter coefficient storage part pre-storing a filter coefficient;
- a shift operation part acquiring a filter coefficient from the filter coefficient storage part and performing a shift operation on the acquired filter coefficient;
- a reset part acquiring a filter coefficient from the filter coefficient storage part and resetting the acquired filter coefficient;
- an adder part acquiring a filter coefficient from the filter coefficient storage part and adding the acquired filter coefficient, and a result of the shift operation; and
- an integrator section integrating the acquired filter coefficient, the result of the shift operation, a result of the reset part, or a result of the addition.

23. The digital filter according to claim 22, further comprises a complementary operation part that acquires a filter coefficient from the filter coefficient storage part, and performs a complementary operation on at least one of the acquired filter coefficient, the result of the shift operation, or the result of the addition.

24. The digital filter according to claim 22, further comprises a control part controlling each operation of the shift operation part, the reset part, and the adder part according to the signal with the first sampling frequency.

* * * * *